United States Patent
Song et al.

(10) Patent No.: US 7,790,548 B2
(45) Date of Patent: Sep. 7, 2010

(54) METHODS OF FABRICATING FIELD EFFECT TRANSISTORS INCLUDING RECESSED FORKED GATE STRUCTURES

(75) Inventors: Bo-Young Song, Gyeonggi-do (KR); Tae-Young Chung, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 108 days.

(21) Appl. No.: 11/944,819

(22) Filed: Nov. 26, 2007

(65) Prior Publication Data

US 2008/0128800 A1    Jun. 5, 2008

(30) Foreign Application Priority Data

Dec. 4, 2006    (KR) .................. 10-2006-0121148

(51) Int. Cl.
*H01L 21/336*    (2006.01)

(52) U.S. Cl. .............. 438/259; 438/270; 257/330; 257/E21.428

(58) Field of Classification Search .......... 438/259, 438/270; 257/329, 330, 331, E21.428
See application file for complete search history.

(56) References Cited

U.S. PATENT DOCUMENTS 5,244,824 A    9/1993    Sivan
7,655,522 B2 *    2/2010    Kim et al. .............. 438/270
2001/0052617 A1 *    12/2001    Kitada et al. .............. 257/330
2006/0234451 A1 *    10/2006    Slesazeck et al. .......... 438/259
2008/0012067 A1 *    1/2008    Wu .............. 257/330
2008/0160700 A1 *    7/2008    Lee .............. 438/270

FOREIGN PATENT DOCUMENTS

KR    0511099    8/2005
KR    2005-0106492    11/2005

* cited by examiner

*Primary Examiner*—Phat X Cao
(74) *Attorney, Agent, or Firm*—Myers Bigel Sibley & Sajovec (57) ABSTRACT

A transistor includes substrate having an active region therein. The active region includes a recess therein having opposing sidewalls and a surface therebetween. A protrusion extends from the surface of the recess between the opposing sidewalls thereof. The transistor further includes a gate insulation layer on the protrusion in the recess, a gate electrode on the gate insulation layer in the recess, and source/drain regions in the active region on opposite sides of the gate electrode and adjacent to the opposing sidewalls of the recess. The gate electrode includes portions that extend into the recess between the protrusion and the opposing sidewalls of the recess. Related methods of fabrication are also discussed.

9 Claims, 7 Drawing Sheets

METHODS OF FABRICATING FIELD EFFECT TRANSISTORS INCLUDING RECESSED FORKED GATE STRUCTURES

CROSS-REFERENCE TO RELATED APPLICATION

This application claims priority under 35 USC §119 to Korean Patent Application No. 10-2006-121148 filed on Dec. 4, 2006, the disclosure of which is incorporated by reference herein in its entirety.

FIELD OF THE INVENTION

The present invention relates to transistors and methods of fabricating the same.

BACKGROUND OF THE INVENTION

Semiconductor devices are continually being developed with an eye toward increased operating speeds at reduced voltages. Also, processes for manufacturing semiconductor devices are being developed with higher degrees of device integration.

For example, in a MOS transistor, a channel length of the MOS transistor may be reduced to increase both operational speed and degree of integration. However, in a planar MOS transistor, as the channel length is reduced, electric fields may affect operation of the planar MOS transistor, for example, due to drain induced barrier lowering (DIBL). Also, a channel-driving capacity of a gate electrode may be deteriorated such that a short channel effects may occur. Furthermore, the mobility of carriers and/or current-driving forces may be reduced due to increased concentration of impurities in the channel region. Moreover, junction leakage current may be increased in accordance with a reduced junction depth of source/drain regions.

To address the above-mentioned problems of two-dimensional planar MOS transistors, three-dimensional transistors have been developed. Examples of the three-dimensional transistor include recessed channel array transistors (RCAT), fin field effect transistors (FinFET), etc. RCATs may have a relatively long channel length and excellent refresh characteristics. However, the RCATs may be limited by a design rule of no more than about 60 nm in view of desired current flow characteristics. In contrast, FinFETs may have excellent current flow characteristics; however, since gate induced drain leakage current (GIDL) may be increased, FinFETs may have poor refresh characteristics.

SUMMARY OF THE INVENTION

According to some embodiments of the present invention, a transistor includes a substrate having an active region therein. The active region includes a recess therein having opposing sidewalls and a surface therebetween. A protrusion extends from the surface of the recess between the opposing sidewalls thereof. The transistor further includes a gate insulation layer on the protrusion in the recess, a gate electrode on the gate insulation layer in the recess, and source/drain regions in the active region on opposite sides of the gate electrode and adjacent to the opposing sidewalls of the recess.

In some embodiments, the gate electrode may include first and second portions that extend into the recess between the protrusion and the opposing sidewalls of the recess. A channel region may extend between the source/drain regions along a surface of the protrusion adjacent to the gate electrode.

In other embodiments, the transistor may further include an insulating spacer on the opposing sidewalls of the recess. The insulating spacer may separate the protrusion from the opposing sidewalls of the recess and may separate the gate electrode from the source/drain regions. For example, the protrusion may be an epitaxial fin extending from the surface of the recess and spaced apart from the opposing sidewalls thereof by the insulating spacer.

In some embodiments, the protrusion may not extend beyond the source/drain regions in the active region. Also, in some embodiments, the active region and the protrusion may be single crystalline silicon.

In other embodiments, the protrusion may have a substantially rounded surface adjacent to the gate electrode. The protrusion may have a width that increases towards the surface of the recess.

In some embodiments, the gate electrode may include a lower portion that extends within the recess and an upper portion that extends beyond the recess and protrudes from the substrate. In addition, the transistor may include second insulating spacers on opposing sidewalls of the upper portion of the gate electrode, and a mask pattern on a surface of the upper portion of the gate electrode between the opposing sidewalls. The second spacers and the mask pattern may be nitride.

According to other embodiments of the present invention, a method of forming a transistor includes forming a recess in an active region of a substrate. The recess has opposing sidewalls and a surface therebetween that includes a protrusion extending between the opposing sidewalls. A gate insulation layer is formed on the protrusion in the recess, and a gate electrode is formed on the gate insulation layer in the recess. Source/drain regions are formed in the active region on opposite sides of the gate electrode and adjacent to the opposing sidewalls of the recess.

In some embodiments, the gate electrode may be formed in the recess such that portions of the gate electrode extend into the recess between the protrusion and the opposing sidewalls of the recess.

In other embodiments, a mask pattern may be formed on the active region of the substrate, and the substrate may be etched using the mask pattern as an etching mask to form the recess in the active region. The protrusion may be formed to extend from the surface of the recess and to be spaced apart from the opposing sidewalls thereof. For example, an insulating spacer may be formed on the opposing sidewalls of the recess, and a selective epitaxial growth (SEG) process may be performed on the surface of the recess to form the protrusion.

In some embodiments, the protrusion may be formed to have a substantially rounded surface between the opposing sidewalls of the recess. In addition, in other embodiments, the protrusion may be formed to have a width that increases towards the surface of the recess.

In some embodiments, a conductive layer may be formed on the substrate and in the recess, a mask pattern may be formed on the conductive layer, and the conductive layer may be etched using the mask pattern as an etching mask to form the gate electrode. The gate electrode may include a lower portion that extends within the recess and an upper portion that extends beyond the recess and protrudes from the substrate. In addition, second insulating spacers may be formed on opposing sidewalls of the upper portion of the gate electrode.

A transistor in accordance with further embodiments of the present invention may include an active pattern, a gate insulation layer, a gate electrode and source/drain regions. The active pattern may include a first region having a recess defined by isolation patterns that are formed in a substrate, and a second region protruding from a bottom surface of the recess. The gate insulation layer may be formed on the second region. The gate electrode may be formed on the gate insulation layer. The source/drain regions may be formed at a surface portion of the first region adjacent to the gate electrode.

In some embodiments, the first region and the second region may include single crystalline silicon. Further, the second region may be spaced apart from a sidewall of the recess. The second region may have a rounded upper surface. The second region may have a width that increases toward the bottom surface of the recess.

In other embodiments, the gate electrode may have a first portion formed in the recess, and a second portion protruding from the substrate. Further, the transistor may additionally include first spacers formed on first sidewalls of the gate electrode, second spacers formed on second sidewalls of the gate electrode, and a mask pattern formed on the gate electrode. The first spacers, the second spacers and the mask pattern may include nitride.

A method of forming a transistor in accordance with some embodiments of the present invention may include forming an active pattern on a substrate. The active pattern may include a first region having a recess defined by isolation patterns that are formed in a substrate, and a second region protruding from a bottom surface of the recess. A gate insulation layer may be formed on the second region. A gate electrode may be formed on the gate insulation layer. The source/drain regions may be formed at a surface portion of the first region adjacent to the gate electrode.

In some embodiments, the substrate may include single crystalline silicon. Further, the active pattern may be formed by forming a mask pattern on the substrate, etching the substrate using the mask pattern as an etching mask to form the first region having the recess, forming spacers on sidewalls of the recess, and performing a selective epitaxial growth process on the bottom surface of the recess to form the second region. The mask pattern and the spacers may include nitride.

In other embodiments, a pad oxide layer may be additionally formed on the substrate. Further, the gate electrode may be formed by forming a conductive layer on the substrate to fill the recess having the spacers, forming a mask pattern on the conductive layer, and etching the conductive layer using the mask pattern as an etching mask. The mask pattern may include nitride.

In still other embodiments, spacers may be additionally formed on sidewalls of the gate electrode protruding from a surface of the substrate. The spacers may include nitride.

DETAILED DESCRIPTION OF EMBODIMENTS OF THE INVENTION

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to nonimplanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Hereinafter, a transistor in accordance with some embodiments of the present invention is described in detail.

Figure 1:
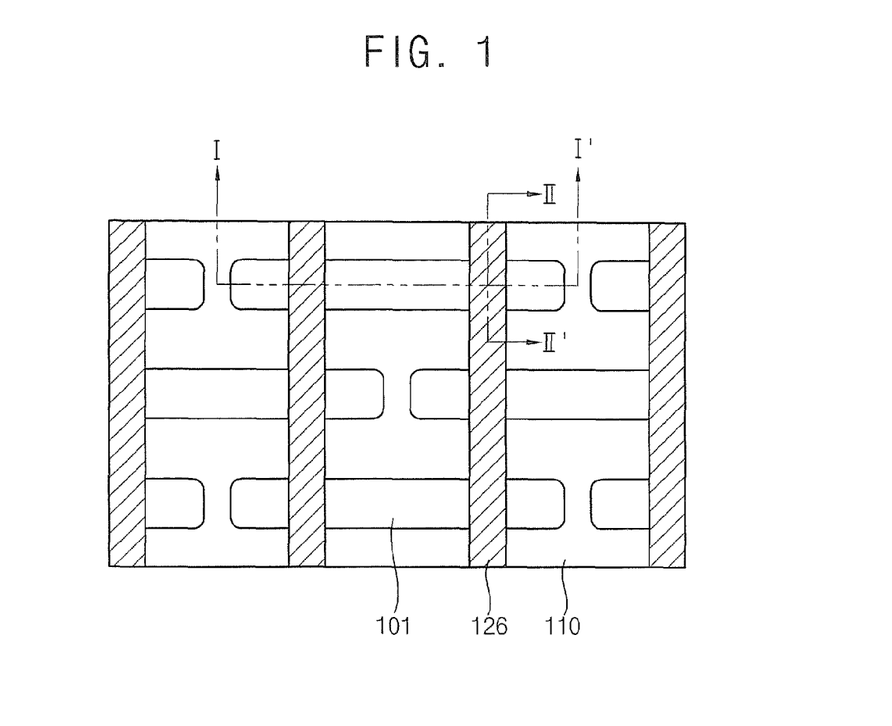
FIG. 1 is a plan view illustrating a transistor in accordance with some embodiments of the present invention.
Figure 2:
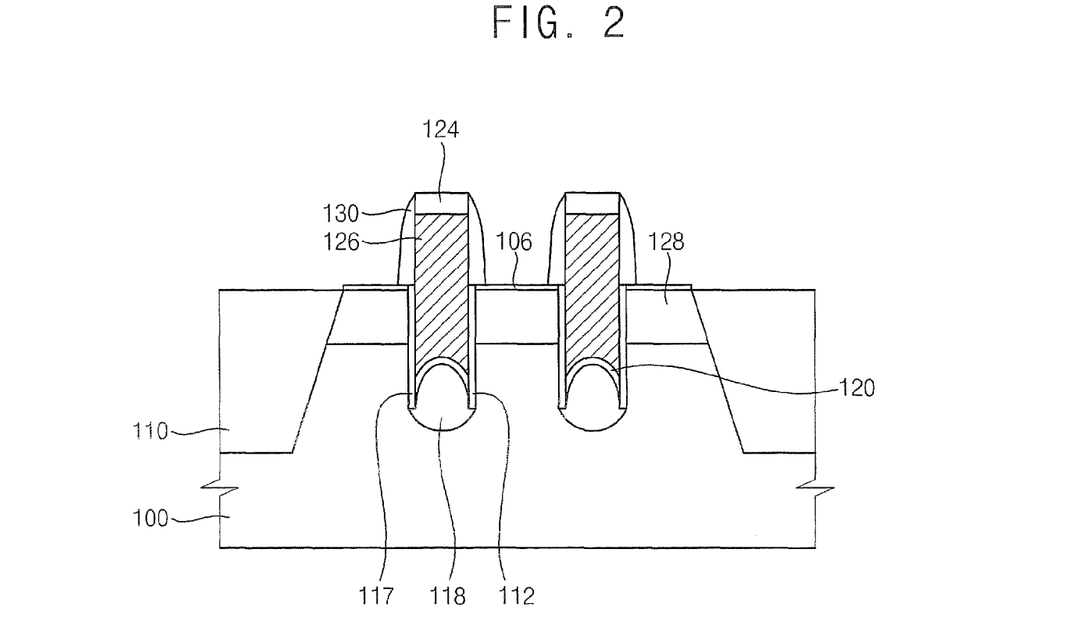
FIG. 2 is a cross-sectional view taken along line I-I' in FIG. 1.
Figure 3:
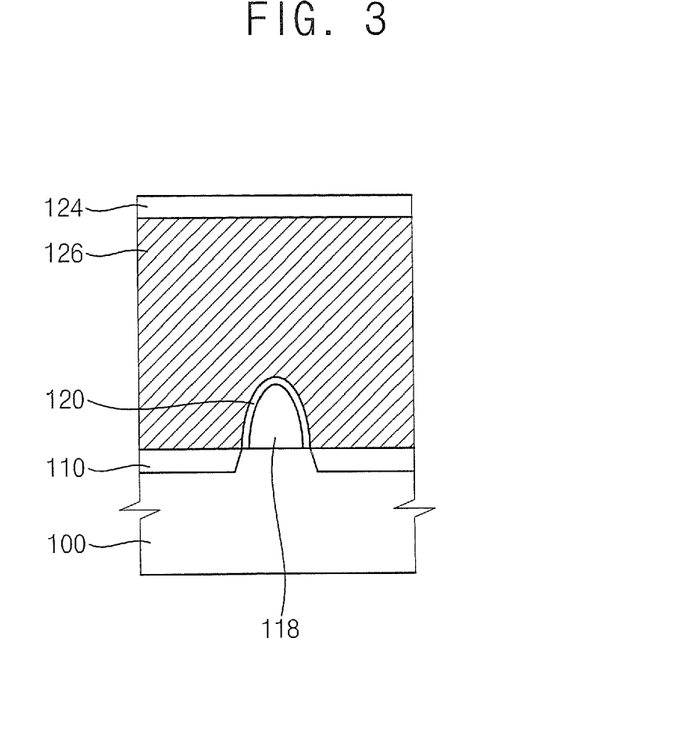
FIG. 3 is a cross-sectional view taken along line II-II' in FIG. 1.

FIG. 1 is a cross-sectional view illustrating a transistor in accordance with some embodiments of the present invention, FIG. 2 is a cross-sectional view taken along line I-I' in FIG. 1, and FIG. 3 is a cross-sectional view taken along line II-II' in FIG. 1.

Referring to FIGS. 1 to 3, a transistor includes an active pattern 101 in an active region defined by isolation layer patterns 110, a gate insulation layer 120 formed on the active pattern 101, a gate electrode 126 formed on the gate insulation layer 120, first spacers 117 and second spacers 130 formed on a sidewall of the gate electrode 126, and source/drain regions 128 formed at a surface portion of the active patterns 101.

The transistor may be formed on a semiconductor substrate 100 such as a silicon wafer. In some embodiments, the semiconductor substrate 100 may be doped with p-type impurities. In addition, the substrate 100 may include a PMOS transistor and an NMOS transistor. When the PMOS transistor is formed, n-type impurities may be implanted into the semiconductor substrate 100 to form an n-well. The isolation layer patterns 110 are formed in the semiconductor substrate 100 to define the active patterns 101.

As shown in FIGS. 2 and 3, the active patterns 101 include a first region having a trench or recess 112 therein. The recess 112 has opposing sidewalls and a bottom surface therebetween, and extends along a direction substantially perpendicular to an extending direction of the isolation layer patterns 110. The active patterns 101 also include a second region 118 protruding from the bottom surface of the recess 112. The second region 118 may also be referred to hereinafter as a "fin" or "protrusion."

The second region 118 may protrude between the opposing sidewalls of the recess 112 but below the surface of the substrate 100. In some embodiments, the protruding second region 118 may not extend beyond the source/drain regions 128 formed in the surface of the substrate 100 adjacent to the sidewalls of the recess 112. The protruding second region 118 of the active pattern 101 may have a rounded upper surface. In some embodiments, the second region 118 may have a relatively convex upper surface. Thus, a width of the second region 118 may increase towards the bottom surface of the recess 112. Further, the second region 118 may be spaced apart from the sidewalls of the recess 112.

In some embodiments, the recess 112 in the first region may be formed by etching the semiconductor substrate 100. Since the second region 118 is formed from the bottom surface of the recess 112, the active patterns 101 may be formed of substantially the same material as that of the semiconductor substrate 100. For example, in some embodiments, the active patterns 101 may include single crystalline silicon.

The gate insulation layer 120 is conformally formed on a surface of the second region 118. As mentioned above, since the second region 118 has a convex upper surface and is spaced apart from the sidewalls of the recess 112 in the first region, the gate insulation layer 120 may be formed along a profile of the second region 118, that is, on the upper surface and sidewalls of the second region 118. As such, portions of the gate insulation layer 120 may contact the sidewalls of the recess 112.

In some embodiments, the gate insulation layer 120 may include oxide. For example, the gate insulation layer 120 may include a silicon oxide layer.

A channel region may be formed under the gate insulation layer 120, i.e., along the surface of the second region 118 extending between the source/drain regions 128. The channel region may be substantially similar to that of an RCAT, such that transistors according to some embodiments of the present invention may have some operational characteristics substantially similar to those of the RCAT. That is, transistors according to some embodiments may have a relatively long channel length. Further, transistors according to some embodiments may have a relatively low gate induced drain leakage current. As a result, transistors according to some embodiments of the present invention may have improved refresh characteristics.

Still referring to FIGS. 1 to 3, gate electrodes 126 are formed on the gate insulation layer 120. As such, the gate electrodes 126 are formed in the recess 112 such that two portions or prongs extend along sidewalls of the protruding second region 118. Thus, portions of the gate electrodes 126 in the recess 112 may have a forked structure that provides an increase in channel length between the source/drain regions 128. Further, the gate electrodes 126 may have a substantially linear shape extending along a direction substantially parallel with the direction in which the recess 112 extends in the active patterns 101. More particularly, each gate electrode 126 may have a lower portion formed in the recess 112 and an upper portion protruding from the surface of the semiconductor substrate 100. The lower portion of the gate electrode 126 may contact the gate insulation layer 120. Further, the upper and lower portions of the gate electrodes 126 may be substantially similar in width.

The gate electrodes 126 may include a conductive material. For example, the gate electrodes 126 may include polysilicon doped with impurities, metal, metal silicide, metal nitride, etc. These can be used alone or in combination. When the gate electrodes 126 include polysilicon doped with impurities, the type of transistor may vary based on the type of impurities. More particularly, when the impurities include p-type impurities such as boron, the transistor may be a PMOS transistor. In contrast, when the impurities include n-type impurities such as nitrogen or arsenic, the transistor may be a NMOS transistor.

Since the gate electrode 126 is formed on the gate insulation layer 120 on the protruding second region 118, the gate electrode 126 making contact with the gate insulation layer 120 may provide a structure substantially similar to that of a FinFET. Thus, the transistor including the gate electrodes 126 may provide some operational characteristics substantially similar to those of a FinFET. That is, a threshold voltage of the transistor may be controlled by adjusting a height of the second region 118. Further, an operating speed of the transistor may be increased by adjusting the height of the second region 118.

Additionally, respective mask patterns 124 may be formed on the gate electrodes 126. The mask patterns 124 may be used as an etching mask for patterning the gate electrodes 126. Further, the mask patterns 124 may protect the gate electrodes 126 during subsequent dry etching process and/or other processes.

In some embodiments, the mask patterns 124 may include nitride. For example embodiment, the mask patterns 124 may include silicon nitride.

The first spacers 117 are formed on lower portions of the gate electrode 126 below the surface of the substrate 100. The first spacers 117 are formed on opposing sidewalls of the recess 112. The first spacers 117 may insulate the source/drain regions 128 and the gate electrodes 126 from each other. In some embodiments, the first spacers 117 may include nitride. For example, the first spacers 117 may include silicon nitride.

The second spacers 130 are formed on upper portions of the gate electrode 126 above the surface of the substrate 100 and sidewalls of the mask patterns 124. The second spacers 130 may protect the gate electrodes 126 during a subsequent etching process and/or other processes. In some embodiments, the second spacers 130 may include nitride. For example, the second spacers 130 may include silicon nitride. Further, the second spacers 130 may include a material substantially the same as that of the first spacers 117. Alternatively, the second spacers 130 may include a material different from that of the first spacers 117

The source/drain regions 128 are formed at a surface portion of the active patterns 101 adjacent to the gate electrodes 126 and on opposite sides of the recess 112. As such, the source/drain regions 128 are formed adjacent to the sidewalls of the recess 112.

In some embodiments, the source/drain regions 128 may be formed by doping impurities. For example, when the impurities include p-type impurities, the transistor including the source/drain regions 128 may be a PMOS transistor. Here, the gate electrodes 126 may include polysilicon doped with p-type impurities. In contrast, when the impurities include n-type impurities, the transistor including the source/drain regions 128 may be a NMOS transistor. Here, the gate electrodes 126 may include polysilicon doped with n-type impurities. Additionally, a pad oxide layer pattern 106 for protecting the first region may be formed on the first region of the active pattern 101.

According to some embodiments of the present invention, a transistor may include both the RCAT structure and the FinFET structure so that characteristics of both the RCAT structure and the FinFET structure may be exhibited. For example, the transistor may have a relatively long channel length and a relatively low gate induced drain leakage current due to the RCAT structure, which may provide improved refresh characteristics. Further, the transistor may have a desired threshold voltage and a rapid operation speed due to the FinFET structure.

Hereinafter, a method of forming the transistor illustrated in FIGS. 1 to 3 will be described in greater detail, according to some embodiments of the present invention.

Figure 4:
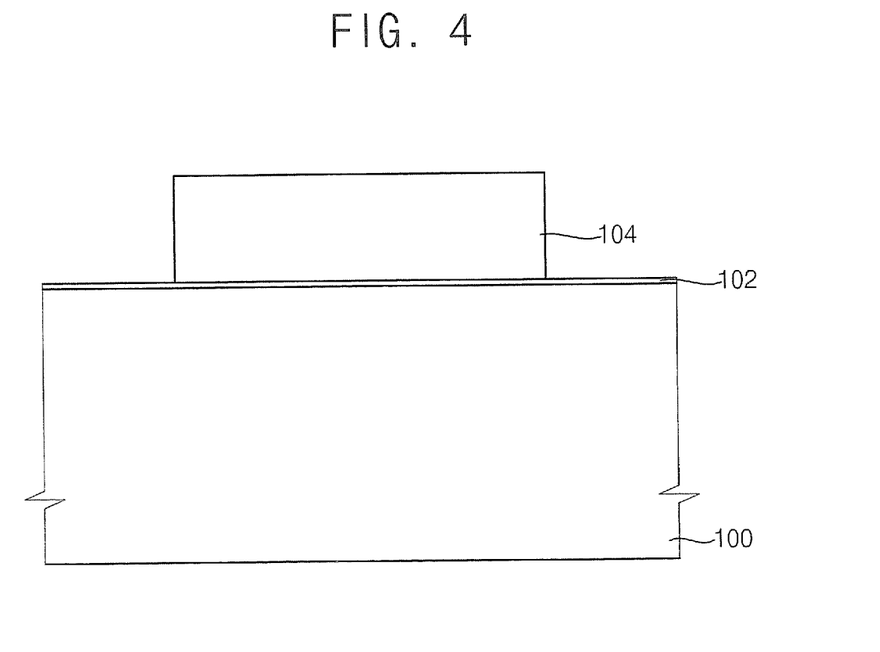
FIGS. 4 to 14 are cross-sectional views illustrating methods of forming the transistor of FIGS. 1 to 3 according to some embodiments of the present invention.

FIGS. 4 to 14 are cross-sectional views illustrating methods of forming the transistor of FIGS. 1 to 3. Referring to FIG. 4, a pad oxide layer 102 and a first mask pattern 104 are sequentially formed on a semiconductor substrate 100 such as a silicon wafer. In some embodiments, the semiconductor substrate 100 may include single crystalline silicon. Further, the semiconductor substrate 100 may be doped with p-type impurities.

The pad oxide layer 102 may suppress stress between the first mask pattern 104 and the semiconductor substrate 100. In some embodiments, the pad oxide layer 102 may be formed on the semiconductor substrate 100 by a thermal oxidation process, a chemical vapor deposition (CVD) process, etc.

The first mask pattern 104 is formed on the pad oxide layer 102. In some embodiments, the first mask pattern 104 may include nitride. Further, the first mask pattern 104 may be formed by a chemical vapor deposition (CVD) process. The first mask pattern 104 may partially expose portions of the pad oxide layer 102 where isolation layer patterns 110 are to be formed. In contrast, active patterns 101 are to be formed on portions of the pad oxide layer 102 that are masked by the first mask pattern 104.

Figure 5:
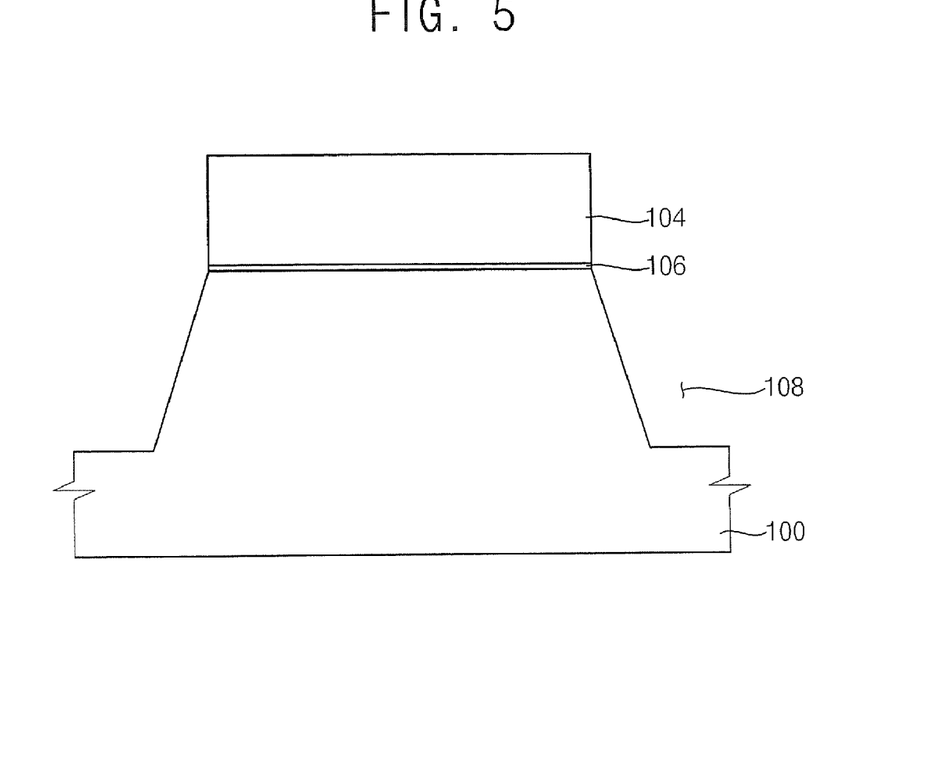

Referring to FIG. 5, the pad oxide layer 102 and the semiconductor substrate 100 are etched using the first mask pattern 104 as an etching mask to form a pad oxide layer pattern 106 and trenches 108. In some embodiments, the etching process may include an overall anisotropic etching process, such as a plasma etching process.

After forming the trenches 108, a thermal oxide layer (not shown) and an insulation liner (not shown) may be additionally formed in the trenches 108. The thermal oxide layer may help cure surface damage to the semiconductor substrate 100 generated during the plasma etching process. In some embodiments, the thermal oxide layer may be formed by thermally oxidizing an inner surface of the trench 108. The insulation liner having a thickness in the range of about several hundreds of angstroms may be formed on the thermal oxide layer. The insulation liner may reduce stress at the isolation layer in the trench 108. Further, the insulation liner may prevent impurities from infiltrating into the isolation layer patterns 110.

Figure 6:
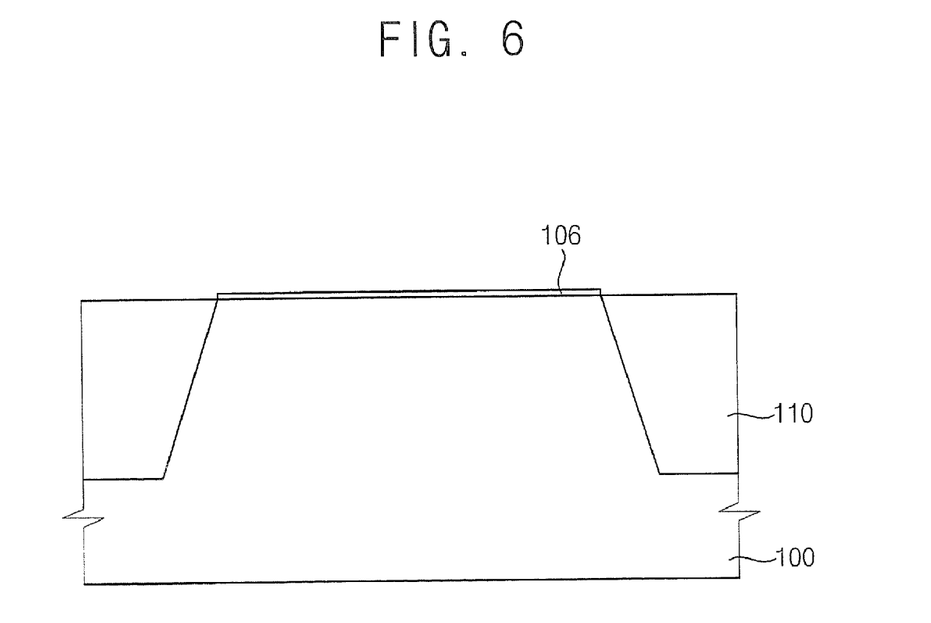

Referring to FIG. 6, the isolation layer (not shown) is then formed on the first mask pattern 104 to at least partially fill the trenches 108. In some embodiments, the isolation layer may include oxide having good gap-filling characteristics. Examples of the oxide may include undoped silicate glass (USG), $O_3$-tetra ethyl ortho silicate undoped silicate glass ($O_3$-TEOS USG), high-density plasma (HDP) oxide, etc.

Further, high-density plasma may be generated using a silane ($SiH_4$) gas, an oxygen ($O_2$) gas and/or an argon (Ar) gas as a plasma source to form an HDP oxide layer. To reduce and/or prevent cracks or voids from being generated in the trench 108, the trench 108 may be filled with a HDP oxide layer having excellent gap-filling characteristics. Additionally, the isolation layer may be annealed at a temperature of about 800° C. to about 1,050° C. under an inactive gas atmosphere to increase a density of a crystalline structure of the HDP oxide layer, which may decrease a wet etching rate with respect to a subsequent cleaning process.

The isolation layer is removed by an etch-back process or a chemical mechanical polishing (CMP) process until an upper surface of the first mask pattern 104 is exposed to form the isolation layer pattern 110. After forming the isolation layer pattern 110, the first mask pattern 104 is removed, as shown in FIG. 6.

Thus, an active region of the semiconductor substrate 100 may be defined by forming the isolation layer patterns 110. In some embodiments, as shown in FIG. 1, the active region may have an elongated or substantially linear shape extending a direction substantially perpendicular to that of the gate electrode 126 formed in a subsequent process.

Figure 7:
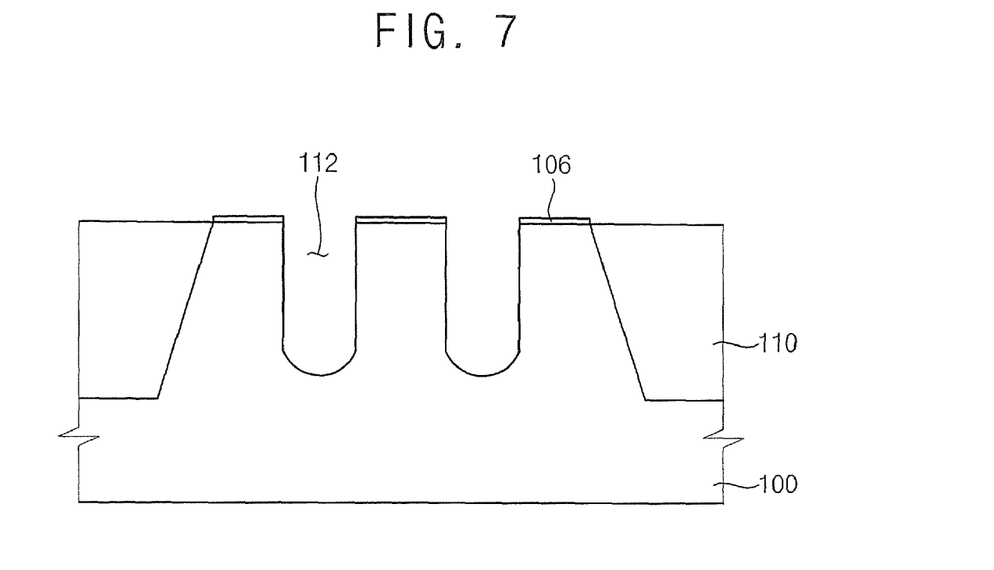

Referring to FIG. 7, a second mask pattern (not shown) is then formed on the semiconductor substrate 100 having the isolation layer patterns 110 to expose portions of the pad oxide layer pattern 106. The pad oxide layer pattern 106 and the semiconductor substrate 100 are etched using the second mask pattern as an etching mask to form trenches or recesses 112. In some embodiments, the recesses 112 may extend along a direction substantially perpendicular to that of the active region. Further, the recesses 112 may be arranged in parallel and spaced apart from each other at substantially similar intervals.

A gate insulation layer 120 may be formed on inner surfaces of the recesses 112 in the active region. Thus, a channel region may include a portion extending along the sidewalls of the recesses 112 by forming the gate insulation layer 120 (and subsequently, the gate electrodes 126) in the recesses 112. As a result, a completed transistor may have an RCAT structure such that the completed transistor may have a relatively long channel length.

Figure 8:
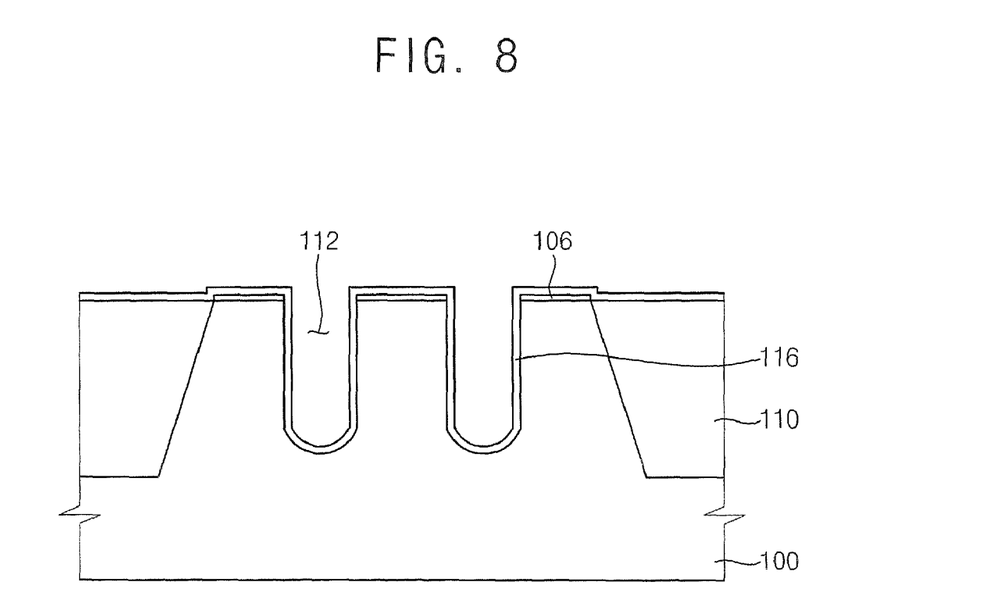

Referring to FIG. 8, a first layer 116 is formed on the isolation layer patterns 110 and the pad oxide layer pattern 106 along the sidewalls and the bottom surface therebetween the recesses 112. In this example embodiment, the first layer 116 may include nitride, such as silicon nitride.

Figure 9:
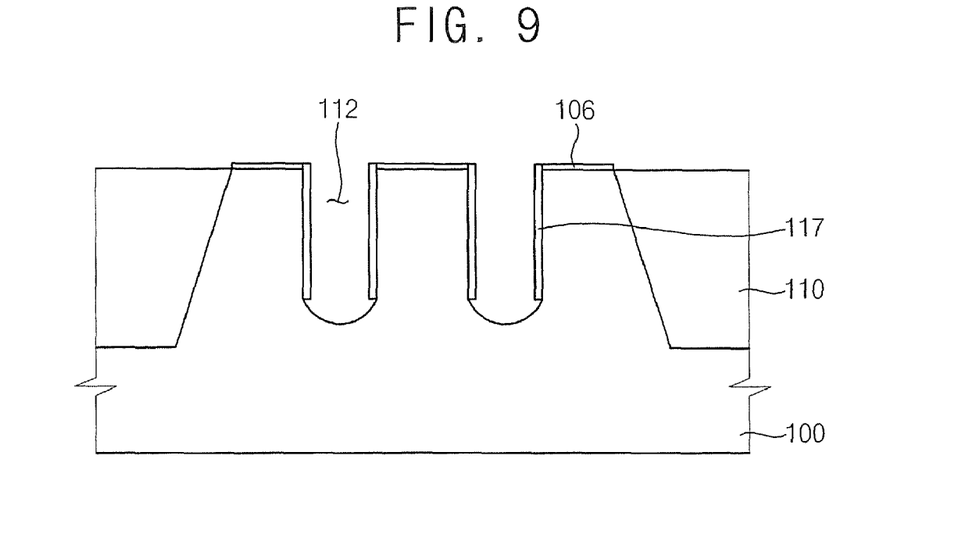

Referring to FIG. 9, the first layer 116 is anisotropically etched to form first spacers 117 on sidewalls of the recesses 112. In some embodiments, the first layer 116 may be etched until upper surfaces of the pad oxide layer pattern 106 and the isolation layer patterns 110 are exposed. Here, since the etching process may be an overall anisotropic etching process, portions of the first layer 116 on the bottom surface of the recess 112 may be etched along with portions of the first layer 116 on the pad oxide layer pattern 106 and the isolation layer pattern 110. In contrast, portions of the first layer 116 on the sidewalls of the recess 112 may not be etched. As a result, the first spacers 117 may be formed on the sidewalls of the recesses 112. The first spacers 117 may suppress growth of an epitaxial layer on the sidewalls of the recesses 112 during a subsequent selective epitaxial growth (SEG) process. Further, the first spacers 117 may insulate a gate electrode 126 and source/drain regions 128 from each other.

Figure 10:
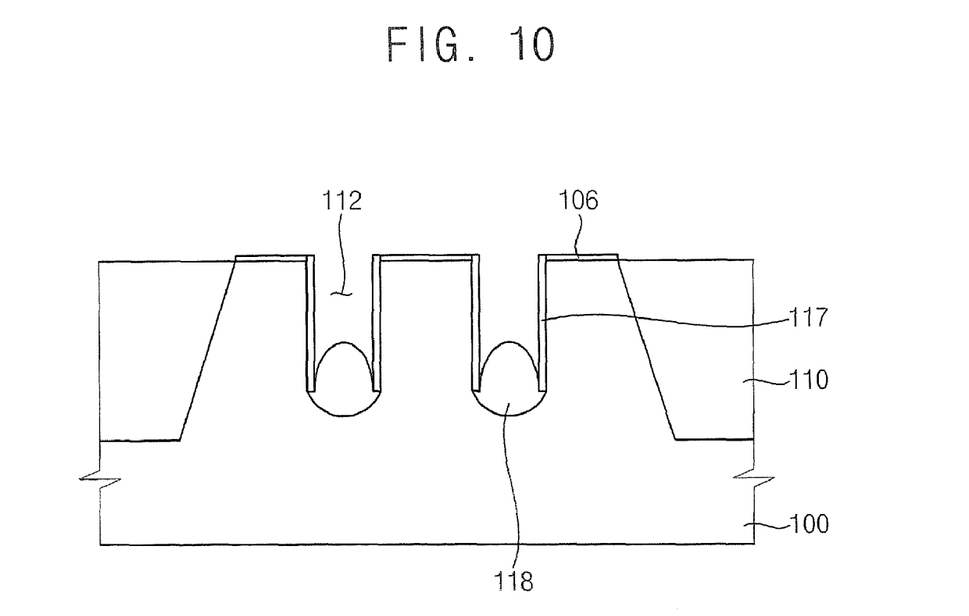

Referring to FIG. 10, an SEG process is carried out on the bottom surface of the recess 112 defined by the first spacers 117 to form a second region 118 of the active pattern 101 protruding from the bottom surface of the recess 112. In some embodiments, recesses 112 may be formed in both the active region and the isolation layer patterns 110. The recess 112 in the active region may be formed by partially etching the semiconductor substrate 100. The recess 112 in the isolation layer pattern 110 may be formed by partially etching the isolation layer pattern 110 including oxide. The active region including the recess 112 may correspond to the first region of the active pattern 101.

The SEG process is performed on the semiconductor substrate 100 including the recess 112 and the first spacers 117 to form the second region 118 including single crystalline silicon protruding from the bottom surface of the recess 112 of the active region. More particularly, a portion of the semiconductor substrate 100 including single crystalline silicon may be exposed through the bottom surface of the recess 112. The SEG process utilizes the exposed single crystalline silicon of the semiconductor substrate 100 as a seed layer to form the second region 118 protruding from the bottom surface of the recess 112. In contrast, since the isolation layer pattern 110 includes oxide, the bottom surface of a recess in the isolation layer pattern 110 (not shown) may not function as a seed layer for the SEG process. As a result, the second region 118 may not be formed on the bottom surface of a recess in the isolation layer pattern 110.

Therefore, the active patterns 101 are formed on the active region of the semiconductor substrate 100. The active patterns 101 include the recess 112 in the first region of the active region and the second region 118 protruding from the bottom surface of the first region. The width and/or height of the second region 118 may be controlled in accordance with the conditions of the SEG process. Further, a threshold voltage of a transistor may be varied based on the height and/or the width of the second region 118. Thus, the threshold voltage of the transistor may be readily controlled by adjusting the height and/or the width of the second region 118.

Further, the second region 118 may have an upwardly protruding, substantially convex rounded upper surface due to the characteristics of the SEG process. Furthermore, the second region 118 may have a width that increases toward the bottom surface of the recess. Since the second region 118 has a rounded upper surface, the phenomena where electrons or holes may be collected at and/or drained from edges of a conventional rectangular structure may be reduced and/or prevented.

Further, since the second region 118 is spaced apart from the sidewalls of the first region and has a downwardly-increasing width, the second region 118 may function as a fin-shaped active structure. Generally, a fin-shaped active structure may be formed on the semiconductor substrate 100 extending from the bottom surface of the recess 112 and between the sidewalls thereof. The gate electrode 126 may be formed on the fin-shaped active structure. As such, the gate electrode 126 is formed on the second region 118. Thus, characteristics of a FinFET may be provided due to the second region 118.

Figure 11:
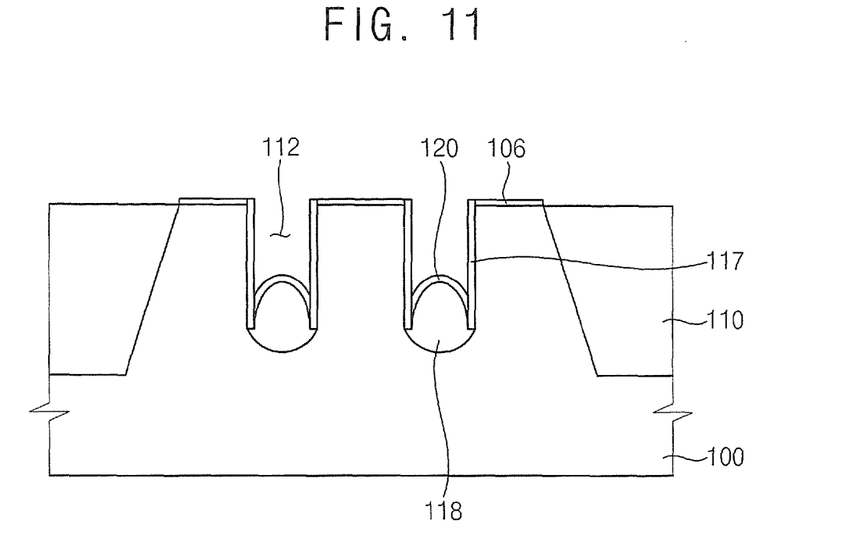

Referring to FIG. 11, a gate insulation layer 120 is formed on the second region 118. In some embodiments, the gate insulation layer 120 may include silicon oxide. Further, the thin gate insulation layer 120 may be formed by a thermal oxidation process, a CVD process, etc. For example, when the gate insulation layer 120 is formed by a thermal oxidation process, the protruding surface of the second region 118 may be selectively thermally oxidized to form the gate insulation layer 120 including silicon oxide on the second region 118. Alternatively, when the gate insulation layer 120 is formed by a CVD process, an insulation layer may be formed on the active pattern 101, the isolation layer pattern 110 and the pad oxide layer pattern 106. The insulation layer may then be patterned to form the gate insulation layer 120 on the second region 118 of the active pattern 101.

Figure 12:
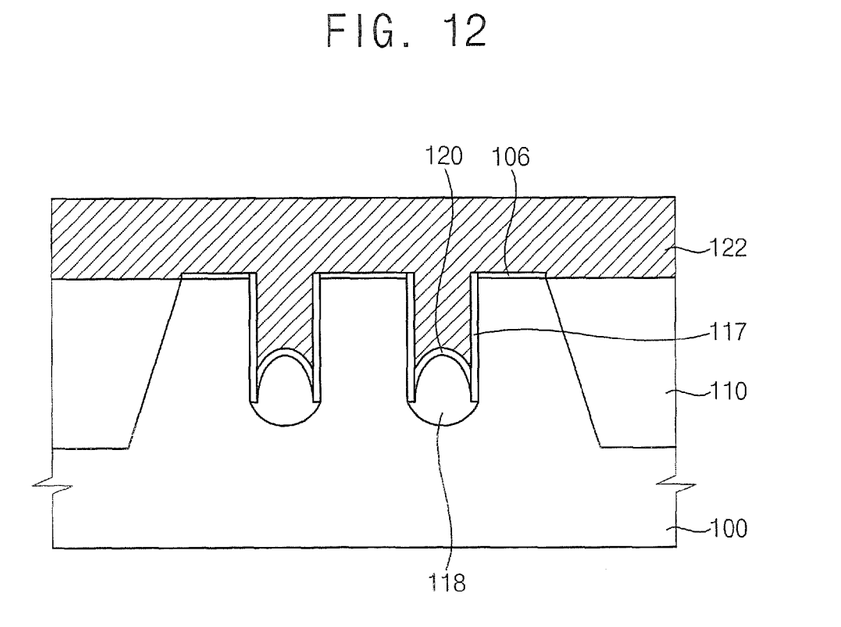

Referring to FIG. 12, a gate conductive layer 122 is formed on the gate insulation layer 120 and the pad oxide layer pattern 106 to fill the recesses 112. The gate conductive layer 122 is patterned by a subsequent process to form gate electrodes 126. Further, the first spacers 117 may be formed on the sidewalls of the recesses 112. In some embodiments, the gate conductive layer 122 may be a polysilicon layer, a metal layer, a metal silicide layer, etc. Alternatively, the gate conductive layer 122 may include a stacked structure including at least two layers among the above-mentioned layers.

Figure 13:
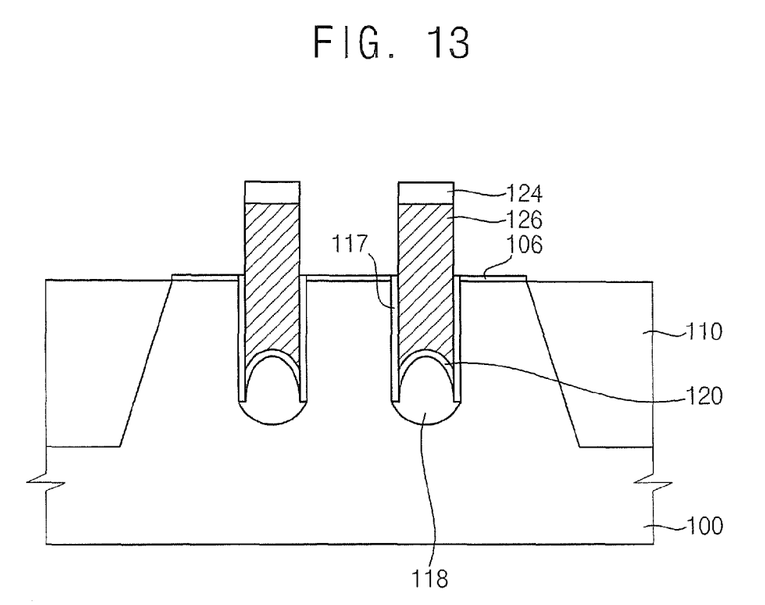

Referring to FIG. 13, a third mask pattern 124 is formed on the gate conductive layer 122. Here, the third mask pattern 124 may be used as an etching mask for patterning the gate conductive layer 122. Further, the third mask pattern 124 may protect the gate electrode 126, for example, during subsequent processing. In some embodiments, the third mask pattern 124 may include nitride, such as silicon nitride.

The gate conductive layer 122 is etched using the third mask pattern 124 as an etching mask to form the gate electrode 126. The gate electrode 126 may include a lower portion in the recess 112, and an upper portion protruding from the semiconductor substrate 100 outside of the recess 112. Further, the first spacers 117 may be formed on the lower sidewalls of the gate electrode 126. Thus, the first spacers 117 may insulate the gate electrode 126 from the source/drain regions 128, which may be formed as discussed below.

Figure 14:
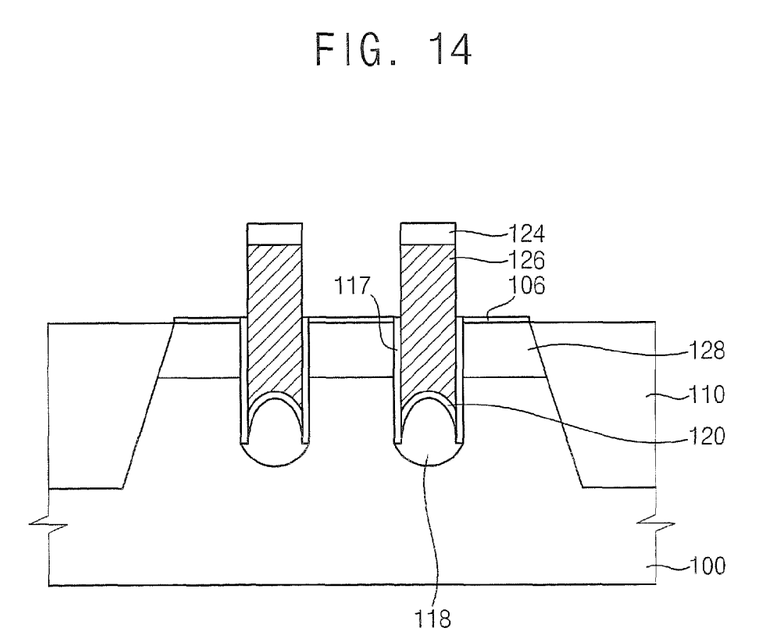

Referring to FIG. 14, source/drain regions 128 are formed at surface portions of the first region adjacent opposite sides of the gate electrode 126 and adjacent to the sidewalls of the recess 112. In some embodiments, impurities may be implanted into the first region to form the source/drain regions 128. The type of transistor may vary in accordance with the type of impurities. For example, when the impurities include p-type impurities, the transistor may be a PMOS transistor. In contrast, when the impurities include n-type impurities, the transistor may be a NMOS transistor.

Further, the impurities may be implanted into the first region by an ion implantation process, a diffusion process, a plasma doping process, etc. According to the ion implantation process, the impurities may be ionized to form ions. The ions may be accelerated to an energy in the range of about dozens KV to several MV. The accelerated ions are thus implanted into the semiconductor substrate. According to the diffusion process, impurity atoms may be implanted into the semiconductor substrate 100 using thermal energy. According to the plasma doping process, plasma may be generated from impurities. The plasma may then be applied to the semiconductor substrate 100. A remote plasma generator may be used to generate the plasma in the plasma doping process.

The gate electrode 126 and the first spacers 117 may thereby define the source/drain regions 128. Thus, an overlapping area between the source/drain regions 128 and the channel region may be reduced such that a gate induced drain leakage current may be decreased.

Referring again to FIG. 2, a second layer (not shown) is formed on the semiconductor substrate 100 having the third mask pattern 124 and the gate electrode 126. In some embodiments, the second layer may include nitride, such as silicon nitride. The second layer is anisotropically etched to form second spacers 130 on an upper sidewalls of the gate electrode 126. Here, the second spacers 130 may protect the gate electrode 126 during subsequent processes. Additionally, although not depicted in drawings, after forming the second spacers 130, impurities may be secondarily implanted into the semiconductor substrate 100 using the second spacers 130 as an ion implantation mask to form source/drain regions 128 having a lightly doped drain (LDD) structure.

Therefore, transistors according to some embodiments, may include the active pattern 101 having the recess 112 and the fin structure, the gate insulation layer 120, the gate electrode 126 and the source/drain regions 128. In other words, transistors completed by the above-mentioned processes may include an active pattern that includes a first region having the recess 112 therein and a second region 118 protruding from the bottom surface of the recess 112 in the first region. As a result, transistors according to some embodiments may include elements of both the RCAT structure including the recessed channel region, and the FinFET structure including the fin structure. Therefore, the transistors may have a relatively long channel length and a relatively low gate induced drain leakage current, owing to the RCAT structure. Further, the transistor may have a readily controlled threshold voltage owing to the FinFET structure. More particularly, since the active pattern of the transistors may have the recess and the fin structure, the transistors may have a relatively long channel length and a relatively low gate induced drain leakage current. Further, the transistor may have a readily controllable threshold voltage based on the width and/or height of the fin structure. As a result, transistors according to some embodiments of the present invention, may have improved refresh characteristics and/or improved reliability.

The foregoing is illustrative of the present invention and is not to be construed as limiting thereof. Although a few example embodiments of this invention have been described, those skilled in the art will readily appreciate that many modifications are possible in the example embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed:

1. A method of forming a transistor, the method comprising:
   forming a recess in an active region of a substrate, the recess having opposing sidewalls and a surface therebetween comprising a protrusion that protrudes in all directions from the surface of the recess between the opposing sidewalls thereof, wherein an entire upper surface of the protrusion is substantially convex;
   forming a gate insulation layer on the protrusion in the recess;
   forming a gate electrode on the gate insulation layer in the recess; and
   forming source/drain regions in the active region on opposite sides of the gate electrode and adjacent to the opposing sidewalls of the recess.

2. The method of claim 1, wherein forming the gate electrode comprises:
   forming the gate electrode in the recess such that portions of the gate electrode extend into the recess between the protrusion and the opposing sidewalls of the recess.

3. The method of claim 1, wherein forming the recess comprises:
   forming a mask pattern on the active region of the substrate;
   etching the substrate using the mask pattern as an etching mask to form the recess in the active region; and
   forming the protrusion extending from the surface of the recess and spaced apart from the opposing sidewalls thereof.

4. The method of claim 3, wherein forming the protrusion comprises forming the protrusion having a substantially rounded surface between the opposing sidewalls of the recess.

5. The method of claim 3, wherein forming the protrusion comprises forming the protrusion having a width that increases towards the surface of the recess.

6. The method of claim 1, wherein forming the gate electrode comprises:
   forming a conductive layer on the substrate and in the recess;
   forming a mask pattern on the conductive layer; and
   etching the conductive layer using the mask pattern as an etching mask to form the gate electrode comprising a lower portion that extends within the recess and an upper portion that extends beyond the recess and protrudes from the substrate.

7. The method of claim 6, further comprising forming second insulating spacers on opposing sidewalls of the upper portion of the gate electrode.

8. A method of forming a transistor, the method comprising:
   forming a mask pattern on an active region of a substrate;

etching the substrate using the mask pattern as an etching mask to form a recess in the active region, the recess having opposing sidewalls and a surface therebetween;

forming an insulating spacer on the opposing sidewalls of the recess;

performing a selective epitaxial growth (SEG) process on the surface of the recess to form a protrusion extending from the surface of the recess between the opposing sidewalls thereof and spaced apart from the opposing sidewalls;

forming a gate insulation layer on the protrusion in the recess;

forming a gate electrode on the gate insulation layer in the recess; and forming source/drain regions in the active region on opposite sides of the gate electrode and adjacent to the opposing sidewalls of the recess.

9. A method of forming a transistor, the method comprising:

forming a recess in an active region of a substrate, the recess having opposing sidewalls and a surface therebetween comprising a protrusion that extends between the opposing sidewalls, wherein an entire upper surface of the protrusion is substantially convex, and wherein the protrusion is formed by a selective epitaxial growth (SEG) process on the surface of the recess;

forming a gate insulation layer on the protrusion in the recess;

forming a gate electrode on the gate insulation layer in the recess; and forming source/drain regions in the active region on opposite sides of the gate electrode and adjacent to the opposing sidewalls of the recess.

* * * * *